United States Patent

Lubbers et al.

Patent Number: 5,684,944
Date of Patent: Nov. 4, 1997

[54] ATOMIC UPDATE OF EDC PROTECTED DATA

[76] Inventors: Clark E. Lubbers, 5301 Pinon Valley Rd., Colorado Springs, Colo. 80919; Susan G. Elkington, 15925 Herring Rd., Black Forest, Colo. 80908

[21] Appl. No.: 514,711

[22] Filed: Aug. 14, 1995

[51] Int. Cl.$^6$ ............................................. G06F 11/00
[52] U.S. Cl. ............................ 395/182.04; 395/185.05
[58] Field of Search .................... 395/182.04, 185.05, 395/441, 439, 440, 445, 182.06, 185.02, 185.07

[56] References Cited

U.S. PATENT DOCUMENTS

| | | | |
|---|---|---|---|
| 4,339,804 | 7/1982 | Davison et al. | 364/900 |
| 4,958,273 | 9/1990 | Anderson et al. | 395/182.09 |
| 5,177,744 | 1/1993 | Cesare et al. | 395/182.04 |
| 5,201,044 | 4/1993 | Frey, Jr. et al. | 395/575 |
| 5,375,128 | 12/1994 | Menon et al. | 395/182.04 |
| 5,379,417 | 1/1995 | Lui et al. | 395/575 |
| 5,396,620 | 3/1995 | Burghart et al. | 395/182.04 |
| 5,402,428 | 3/1995 | Kakuta et al. | 395/182.04 |
| 5,418,921 | 5/1995 | Cortney et al. | 395/425 |
| 5,428,630 | 6/1995 | Weng et al. | 371/40.1 |
| 5,497,457 | 3/1996 | Ford | 395/182.04 |
| 5,502,836 | 3/1996 | Hale et al. | 395/182.01 |
| 5,504,857 | 4/1996 | Baird et al. | 395/182.04 |

FOREIGN PATENT DOCUMENTS

| | | | |
|---|---|---|---|
| A-0569 212 | 11/1993 | European Pat. Off. | G06F 12/08 |

OTHER PUBLICATIONS

Antoine N. Mourad, W. Kent Fuchs, and Daniel G. Saab, "Recovery Issues in Databases Using Redundant Disk Arrays", Journal of Parallel and Distributed Computing, vol. 17, Jan./Feb. 1993, No. 1/2, pp. 75–89.

IBM Technical Disclosure Bulletin, "Preventing Data Loss on Power Off of Exposed Redundant Array of Independent Disks Box", vol. 37, No. 10, Oct. 1, 1994, p. 673.

*Primary Examiner*—Robert W. Beausoliel, Jr.
*Assistant Examiner*—Joseph E. Palys
*Attorney, Agent, or Firm*—Ronald C. Hudgens; Cathy L. Peterson

[57] ABSTRACT

A method for atomically updating Error Detection Code (EDC) protected data in memory such that the EDC protection is maintained to the granularity of a single microprocessor machine instruction. The method is employed in a memory system having a volatile storage area and at least one nonvolatile storage area, each of the storage areas storing a copy of the protected data and two copies of its associated error detection code. The volatile and nonvolatile storage areas each have a first storage location for storing one of the copies of the associated error code and a second storage location for storing the other of the copies of the associated error code. In such a system, a chosen field with the data structure in the volatile copy is updated. Once the volatile copy is updated, a new error detection code is computed with the data in the volatile copy. The new error detection code is then written to the first storage location in each of the storage areas, volatile and nonvolatile, one at a time. Once the copies have been written with the new EDC, the chosen field of the data structure within the nonvolatile copy is updated. Lastly, the new error code is written to the second storage location in each of the updated storage areas.

3 Claims, 5 Drawing Sheets

ATOMIC UPDATE OF EDC PROTECTED DATA

FIELD OF THE INVENTION

The present invention relates generally to a data storage system utilizing memory for storing Error Detection Code (EDC) protected data structures. In particular, the invention is described with reference to a method for modifying data in protected data structures such that the integrity of the Error Detection Code is maintained.

BACKGROUND OF THE INVENTION

A typical computer data processing system generally involves a system memory accessible to one or more host CPUs. Due to their critical nature, certain types of data and data structures stored in one or more copies of system memory are protected by error detection codes to ensure the validity of the data stored in those data structures. When a portion of data is updated in one or more copies in memory according to a set of instructions of an update algorithm, the performance of that update is guaranteed only to the extent of the write operation of an issuing instruction. In other words, the update is guaranteed only for the amount of data which can be atomically written. The term "atomic write" is used in the art to define a write operation to a memory device or storage unit in which the operation, once initiated, results in data being completely and reliably written to the device, or indicates in some manner that data was not written, thus providing for recovery from the operation. Therefore, an atomic write will either succeed or fail in its entirety. If it fails, that portion of data to be updated remains unchanged. In support of certain instructions which require indivisible back-to-back memory accesses, most microprocessors have provisions for special "atomic" instructions.

Atomicity across the entire sequence of operations—including the recomputation and update of the error detection code associated with the data updated—comprising the update algorithm, however, is not so ensured. If an update terminates prior to completion due to a processor interruption such as a power failure, hardware malfunction or the occurrence of a system interrupt routine, the error detection code which serves to detect data corruptions may itself be lost or corrupted as a result. Thus, it is necessary to ensure that the data structure always has a valid error detection code regardless of how or when the update algorithm is interrupted.

One prior technique known to the inventors hereof involves raising the priority of the update program to inhibit interrupts during its execution, since interrupts force a change in the sequence of software execution and cause an update operation to terminate prior to completion. Although such an approach will inhibit most interrupts, it cannot guarantee failure atomicity. For example, it does not eliminate the occurrence of nonmaskable interrupts, which cannot be disabled by software alone, or system "hangs". Thus, it is difficult to completely eliminate exception conditions in the system hardware and guarantee noninterruptable operation such that critical memory data, particularly, EDC-protected data, can be atomically updated while maintaining EDC validity.

Other art within the field has suggested ways of achieving atomic updates. Several discuss the use of logs for storing the steps of a currently executing transaction such that the entire transaction may be recovered and reexecuted if necessary. In U.S. Pat. No. 5,201,044 to Frey, Jr., et al., a transaction logging and control system for data in a distributed data processing system is described and employs a mechanism which assures distributed file system consistency in the event of a system malfunction. The system includes both volatile and nonvolatile memories and provides a method for recovering from malfunction occurring during a transaction that prevents microscopic transactions from being lost. The method provides for a log file, spanning both volatile and nonvolatile memories, for maintaining a record of the file transaction—the record including both the old and new images resulting from such transaction. Similarly, U.S. Pat. No. 5,379,417 to Lui et al., discloses a RAID array storage system which employs nonvolatile memory sufficient for storing all data modification operation command information for data records that have not been successfully written to storage units of the array for use in subsequent retries. Generally, this type of approach requires the allocation of memory dedicated to its purpose and has associated with it a significant performance impact in that the entire operation is repeated upon recovery. While it may be appropriate for ensuring the atomicity of certain types of operations such as RAID reconstruction operations in RAID array systems, it may not be the most efficient use of system resources in guaranteeing the atomicity of EDC-protected data updates.

Therefore, a need exists in the art to provide a simple technique for updating EDC-protected data in memory such that the EDC protection is consistently maintained to the granularity of a single machine instruction and is, therefore, never lost unless the protected data itself becomes corrupted. It is desirable to do so without incurring significant performance penalties or consuming valuable memory space.

SUMMARY OF THE INVENTION

Accordingly, it is an object of the present invention to provide a method for atomically updating error detection code protected data in memory such that the validity of the error detection code is maintained to the granularity of single machine instruction.

In a broad sense, the above and other objectives are attained by a method for atomically updating error detection code protected data stored in a memory system storing at least one copy of the data. In the preferred embodiment, the update method is employed in a memory system having at least two storage areas—one, preferably volatile, storage area, and at least one other, preferably nonvolatile, storage area. Each storage area stores a copy of the protected data and two copies of its associated error detection code. The volatile and nonvolatile storage areas each have a first storage location for storing one of the copies of the associated error code and a second storage location for storing the other of the copies of the associated error code. In such a system, a chosen data field within the data structure in the volatile copy is updated. Once the volatile copy is updated, a new error detection code is computed using the data in the volatile copy. The new error detection code is then written to the first storage location in each of the storage areas, volatile and nonvolatile, one at a time. Once the copies have been written with the new EDC, the chosen data field within the data structure of the nonvolatile copy is updated. Lastly, the new error code is written to the second storage location in each of the updated storage areas.

In another embodiment, only one memory copy is needed to perform the update. Preferably, that one copy is stored in a nonvolatile storage area. The new EDC is nondestructively computed and written to the first storage location. Once the new EDC has been written, the chosen data field is updated for the new data. When the update of the chosen data field has been completed, the second storage location is then written with the new EDC.

The method of the present invention offers several advantages. It allows for the atomic update of error detection code protected data stored in memory in such a manner that the integrity of the error detection code can be maintained to the granularity of a single machine instruction. Further, it provides for such an atomic update without costing a system user either valuable memory space or performance.

BRIEF DESCRIPTION OF THE DRAWINGS

The above objects, features and advantages of the present invention will become more apparent from the following detailed description taken in conjunction with the accompanying drawings, in which.

DESCRIPTION OF THE PREFERRED EMBODIMENT

Figure 1:
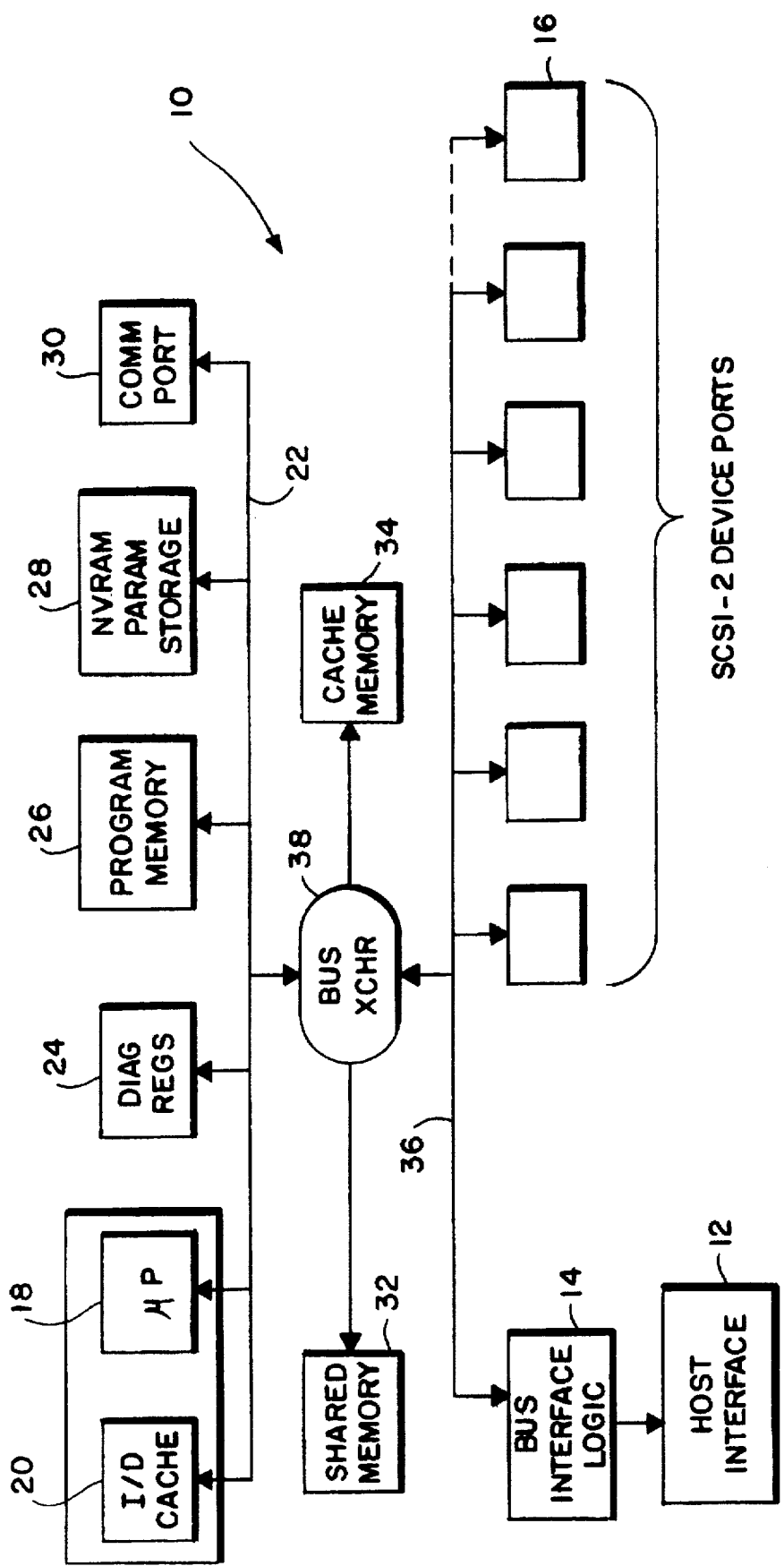
FIG. 1 is a block diagram of a storage controller in a computer system which utilizes a method of atomic memory update according to the principles of the present invention.

An example of a system environment which utilizes the method of the present invention is a storage controller 10, illustrated in FIG. 1. Referring to FIG. 1, the storage controller 10 bridges a host interface 12 via a bus interface logic block 14 to one or more SCSI-2 device ports 16, which provide an access path to a physical media (not shown). The controller further includes a microprocessor 18 and its external instruction/data cache 20. Sharing a native bus 22 used by the microprocessor are several memory devices— diagnostic registers 24, a program memory 26, an NVRAM 28—and a communications port 30. The program memory 26 contains the controller firmware—including the update routine of the present invention—and is read each time the controller boots. The NVRAM 28 stores parameter information entered by a user and by the controller software. The communications port 30 is used for a controller console terminal.

The controller of FIG. 1 also includes a shared memory 32, which includes memory control and DRAM buffer memory functions, and a nonvolatile cache memory 34. Although not shown in detail, the nonvolatile cache memory 34 utilized in the preferred embodiment is implemented in commercially available DRAMs and battery-backup support hardware. Separate buses containing the shared memory 32 and cache memory 34 are interconnected to the native bus 22 and a bus 36 used to access the host interface through the bus interface logic block 14 and serial device ports 16 by way of a bus exchanger 38. The bus exchanger is a crossbar which provides fast access by all entities to all parts of the controller. In addition to providing required bus interface logic, the bus interface block 14 may also include and thus represents other functional components typically needed to perform low level device and host port operations support.

As in other types of system applications, certain data structures stored in the controller's memory are of such a critical nature as to warrant special protection. That is, the controller requires some mechanism by which it can detect data corruption due to hardware or software bugs and take appropriate corrective measures. To ensure the integrity of a data structure of arbitrary size (N fields), the data space is protected by two copies of an error detection code, neither of which contributes to the error detection code. Preferably, the fields occupied by the error detection code immediately follow the data structure in memory. The error detection code is a checksum which can be generated by performing an EXCLUSIVE OR of successive bits in the same bit position in successive fields according to known design schemes; however, it is intended that the present invention be generally applicable to systems which utilize any type of error detection code which is a function of all the data it protects, regardless of the particular technique used.

In the preferred embodiment, the protected data structure is stored in the nonvolatile cache memory 34. Additionally, the data structure is shadowed in the shared memory 32 and NVRAM 28 as such duplication of frequently referenced data allows it to accessed more efficiently. During normal system operation, writes are performed to the volatile shared memory 32 and the nonvolatile cache memory 34, as well as the NVRAM 28. Therefore, in the preferred embodiment shown in FIG. 1, the protected data may be found in one volatile copy located in the shared memory 32 and in several nonvolatile copies—one located in the NVRAM 34 and at least one other in the nonvolatile cache memory 18—as indicated above.

The system as thus described with reference to FIG. 1 is intended to illustrate only those aspects of a storage controller which pertain to the present invention. Hence, some functions are omitted or and others simplified to a level appropriate to a discussion of the present invention. Nor is the scope of the invention limited by the particular features of the illustrated system. The principles of the present invention are generally applicable to any system having a processor coupled to a memory containing EDC protected data.

The maximum amount of data that may be updated at any time is dependent on machine architecture. Hence, the amount of data is constrained to the largest amount of data which can be written by a single microprocessor machine instruction such that, if the address is valid, either all of the data or none of the data is written. The microprocessor 18 shown in the illustrated embodiment of FIG. 1 may be any commercially available processor, such as the Intel i960 (TM). The i960, for example, is capable of quadword (16 bytes) memory operations. Thus, protection against processor interruption can be met with arbitrary alignment of data where the data field and the two EDCs following the protected data structure are 16 bytes or less.

It is possible that a write to a valid address may only partially succeed under certain circumstances. That is, the memory system could fail between writes to successive memory locations of the size of the data bus. As a result, the first x locations are written but the memory system locks up before the remaining y locations are updated. To meet this more stringent protection requirement, it becomes necessary to restrict updates according to the data bus size. Consequently, for a 32-bit data bus, the size of the data field and EDCs is less than or equal to one longword (4 bytes) and the data field and EDCs must be aligned to a 4 byte boundary. Thus, there are two levels of protection available via the mechanism of the present invention, and the level selected is a matter of design choice based on reliability and cost factors.

Figure 2:
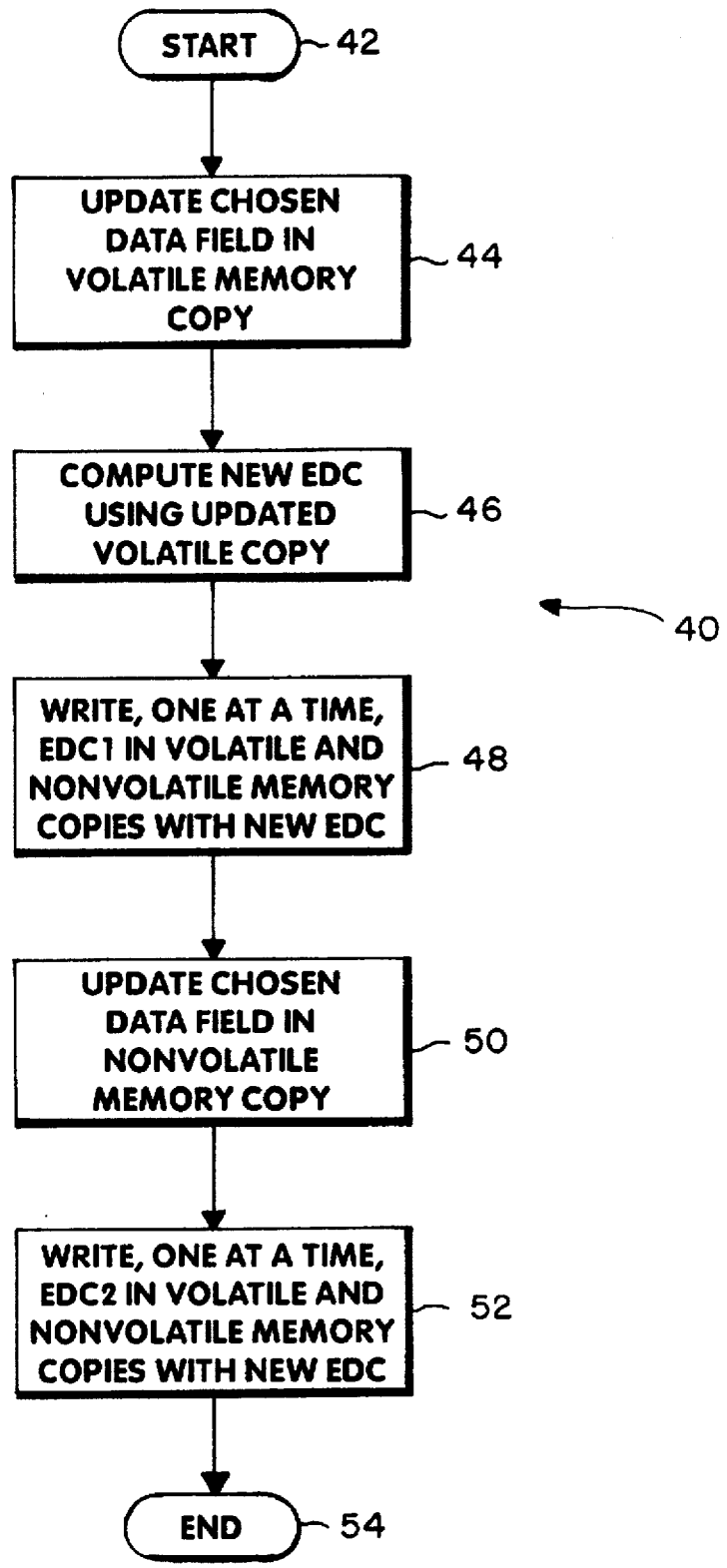
FIG. 2 is a flow diagram of the atomic memory update method of the present invention which uses at least two memory copies of an EDC protected data structure.

Given one, preferably volatile, copy and at least one other, preferably nonvolatile, copy of the protected data structure, an overview of the method of the present invention is provided in the steps of a flow diagram illustrated in FIG. 2. Referring to FIG. 2, the atomic update algorithm 40 begins execution 42 and proceeds to update a chosen data field with the data structure of a volatile copy 44 with the new data value. Again, the field size is defined to be less than or equal to the maximum number of bytes that can be "atomically" written by the microprocessor with a single instruction and the field is aligned such that the write to it will be atomic. Thus, the amount of data that can be atomically written will vary with the hardware architecture. After updating the chosen data field, a new EDC is computed using the volatile copy 46. Referring to step 48, a first storage location, an EDC field "EDC1" for storing the error detection code which protects the data structure, is written with the new EDC computed in step 66 in the volatile and nonvolatile copies. The copies are written one at a time. The same chosen data field updated in the volatile copy in step 44 is then updated in the nonvolatile copy as indicated in step 50. Lastly, a second storage location, an EDC field "EDC2", is written with the new EDC in the volatile and nonvolatile copies, the copies being written one at a time 52. The update is thus concluded 54. If a failure or crash occurs at step 48 while storing the new EDC in EDC1 of the nonvolatile copy, the code in EDC2 will still be valid. If a failure or crash should occur at step 52 while storing the new EDC in EDC2 after the new data has been written, then EDC1 will still have valid EDC. Hence, this method is designed to allow update of the protected structure in a manner which tolerates interruption at any point by any of a variety of events. That is, EDC validity is maintained. EDC protection will only be "lost" (i.e., inconsistent with the data it protects) if the protected data becomes corrupt, the precise reason for having the EDC protection.

For further clarification, the various stages of an atomic memory update according to the principles of the present invention are depicted in FIGS. 3A–3E. FIGS. 3A–3E illustrate an atomic update given duplicate copies of a 512 byte memory page 60 occupied by the data structure, the structure being organized as longwords of four consecutive bytes. The copies include a volatile copy 60a (physically located in a volatile storage area depicted in the system of FIG. 1 as shared memory 32) and one or more nonvolatile copies 60b. The nonvolatile copies are physically located in several nonvolatile storage areas depicted in the system of FIG. 1 as including the nonvolatile cache memory 34 and the NVRAM 28. Thus, the volatile and nonvolatile storage areas each store a copy of the data structure and two copies of the error detection code which covers it.

Figure 3A:
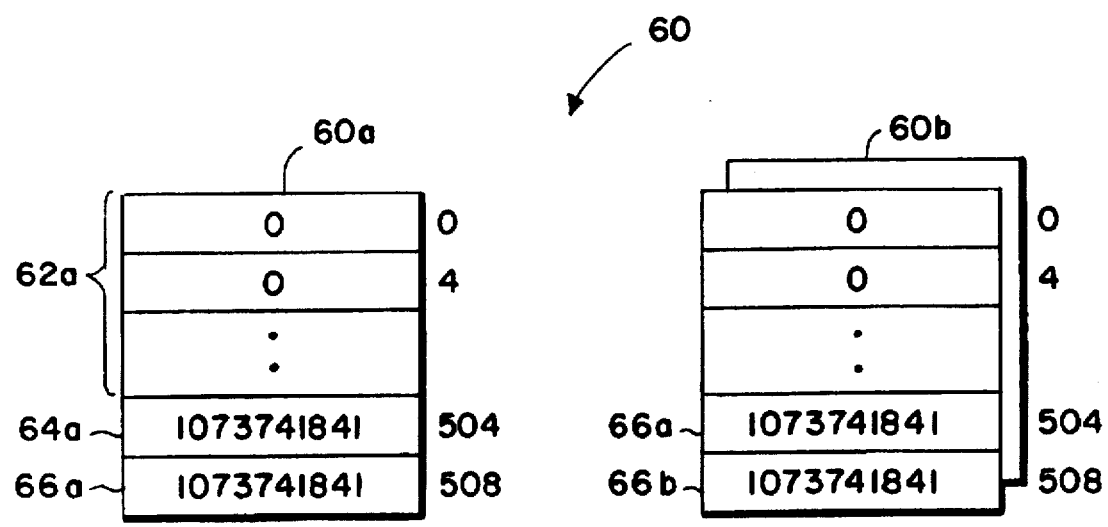
FIGS. 3A–3E depict an EDC protected, 512 byte data structure stored in a page of memory in sequential stages of atomic update according to the method of FIG. 2.
Figure 3B:
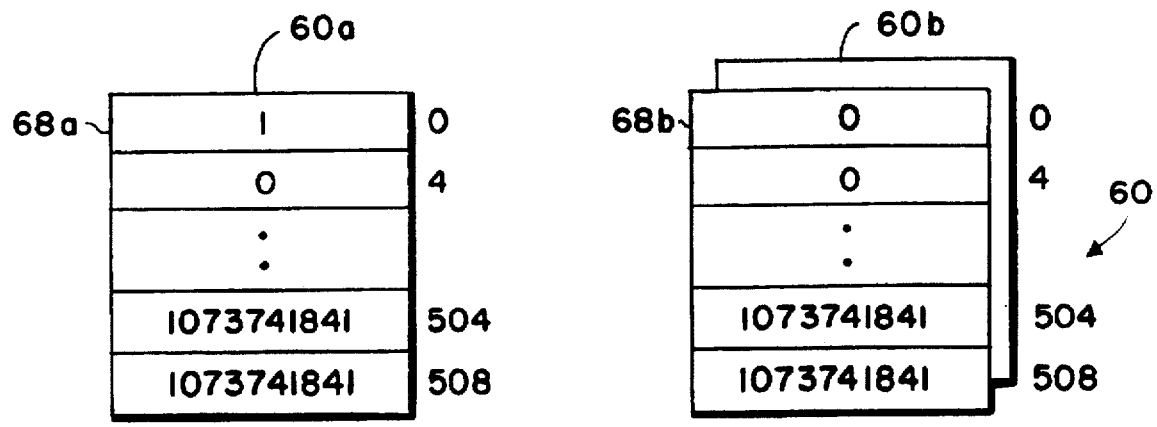
Figure 3C:
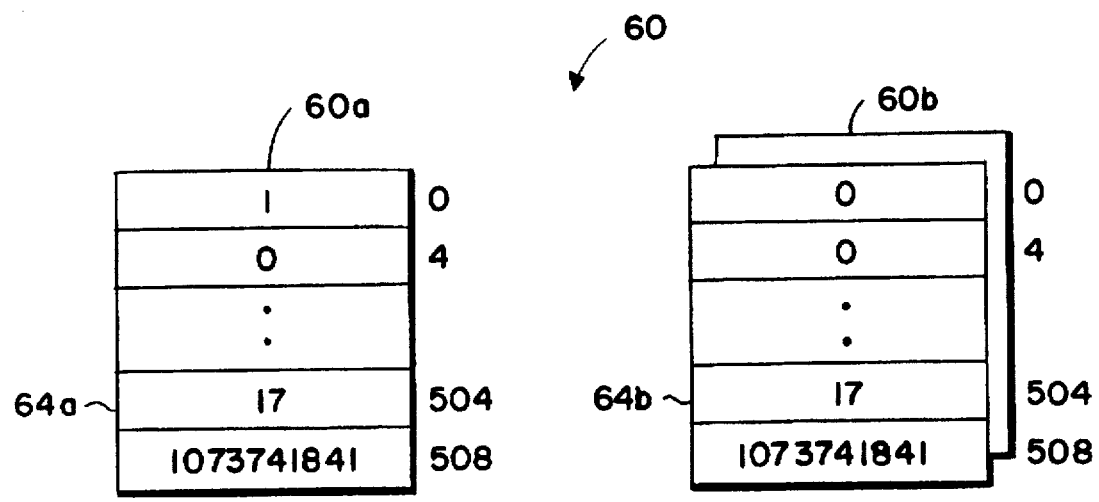
Figure 3D:
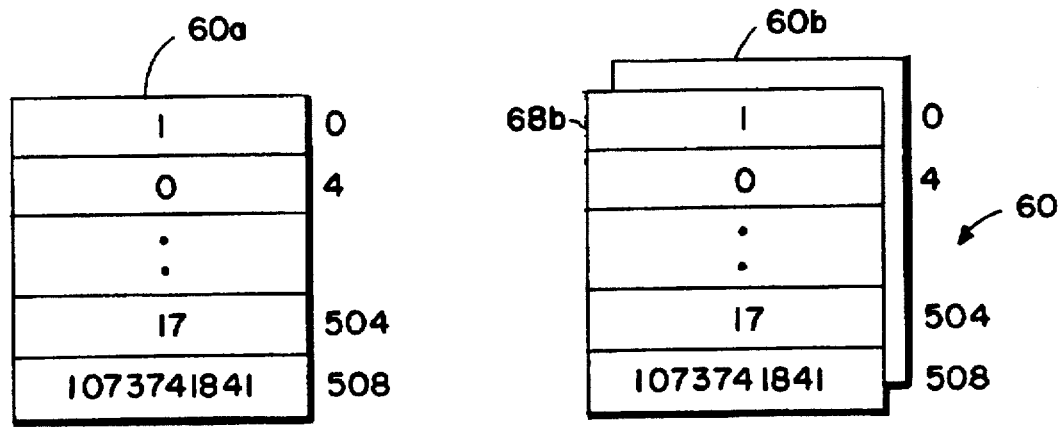
Figure 3E:
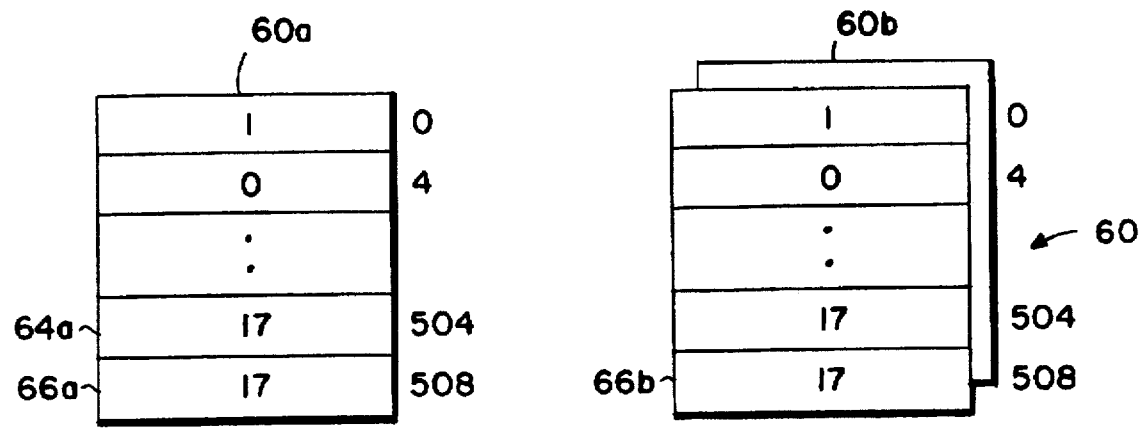

Referring now to FIG. 3A, the protected data 62a is initially "zeroed" data. A first EDC longword 64a, 64b ("EDC1") contains one copy of the EDC and a second EDC longword 66a, 66b("EDC2") contains the other copy. In FIG. 3B, a chosen data field 68a within the data structure of the volatile copy 60a is updated. Following this update, new error detection code is computed over the protected data contained in the data fields 62a within the data structure of the volatile copy 60a. In this example, the new EDC=17 (decimal). Subsequently, the volatile memory copy 60a and at least one of the non-volatile memory copies 60b are updated one at a time by writing the first EDC field 64a, 64b with the new error code as shown in FIG. 3C. The chosen field 68b in at least one of the non-volatile memory copies 60b is then updated, and the second EDC field 66a, 66b (both volatile and nonvolatile copies) is written with the computed new error code.

The foregoing mechanism may be implemented so as to protect as many of the nonvolatile copies as desired. Those copies not covered by the update method would be written with the new data and EDC at a subsequent point in time. For example, and with reference to FIG. 1, it may be preferable to extend the protection afforded by the update method to the nonvolatile cache memory 34 but not the NVRAM 28. In this case, only the cache memory would be updated as indicated in steps 48, 50 and 52 of FIG. 2

In the preferred embodiment as thus described, the volatile copy 60a is restored from a nonvolatile copy stored in one of the nonvolatile storage areas during system boot. If one of the EDCs of the nonvolatile copy does not match, the mismatch is detected and the invalid EDC is "repaired" at that time, as the atomic update method will fail if the EDCs are not identical and valid when it commences. Thus, prior to any updates, the current EDC must be computed over the data and checked against both EDC copies. If one EDC is invalid (i.e., does not match the computed EDC), it will be corrected. The EDC protected data structure is considered "sound" if either EDC matches the computed one. Thus, a random store into the structure will render it "unsound", since neither EDC is likely to match as a consequence. It is desirable to maintain more than one non-volatile copy in a particular nonvolatile storage area (for example, cache memory 34 of FIG. 1), as either a wild store or data loss to one longword will destroy a copy.

Figure 4:
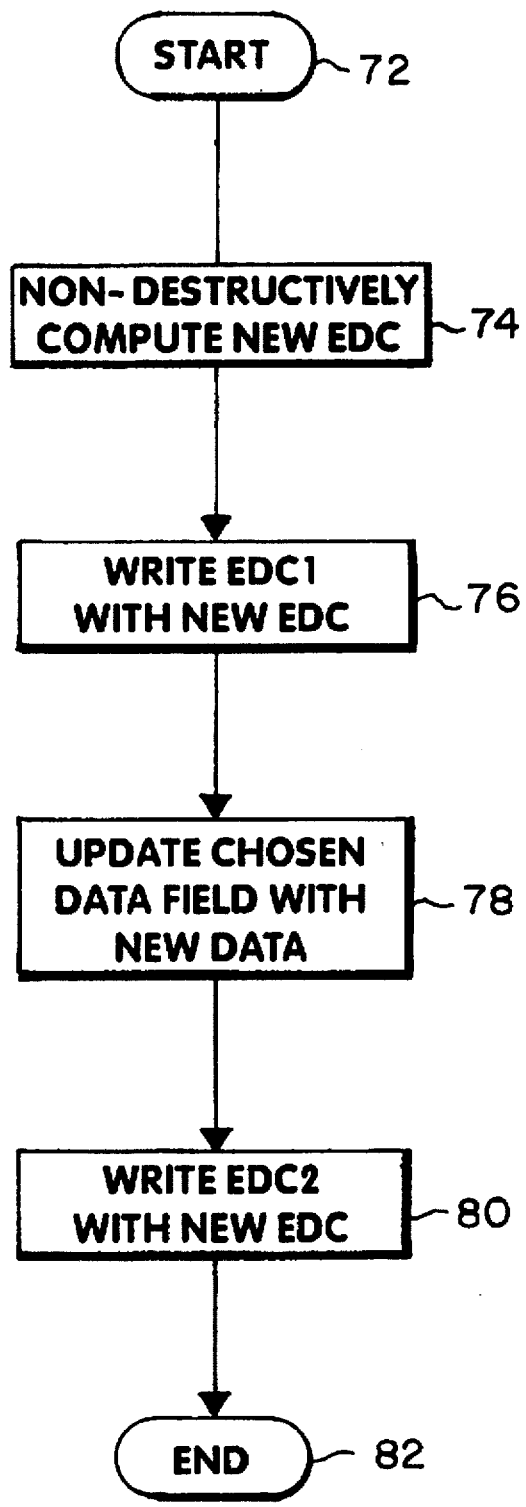
FIG. 4 is a flow diagram illustrating the atomic memory update method of the present invention which uses only one memory copy of an EDC protected data structure.

Another embodiment of the method of the present invention involves the use of only one memory copy and that copy may be volatile or nonvolatile, preferably nonvolatile for data retention capability. To illustrate this alternative embodiment of the present invention, FIG. 4 shows the atomic update method when only one memory copy (preferably nonvolatile) is used or available for use. The method is thus described with respect to one of the nonvolatile copies 60b of FIG. 3. Referring to FIG. 4, the update algorithm commences 72 and non-destructively computes the new error detection code. That is, the new EDC is computed using the current data in each field of the data structure until the data field to be updated (i.e., the chosen data field) is reached. For that field, the new data is substituted for the old data in the EDC calculation. The computation then continues using the current data for the remainder of the fields in the data structure. This computation is "non-destructive" in the sense that no changes to the data structure are required to perform the calculation. Hence, the EDCs are still valid, as they were at the completion of step 46 in FIG. 2. Note that, in contrast, the embodiment illustrated in FIGS. 1—3 can tolerate having one copy (the volatile copy) destroyed in performing the EDC computation. Referring again to FIG. 4, the new EDC is written to EDC1 76. The chosen data field is then updated with the new data 78. EDC2 is updated with the new EDC 80 after the new data is written, thus concluding the update operation 82. Again, the update can be performed only if the EDCs are identical and valid, or one EDC is valid and the invalid EDC is corrected.

Although the above description has proceeded with reference to a specific embodiment of the invention, the invention is not necessarily limited to the particular embodiment shown herein. It is to be understood that various other adaptations and modifications may be made within the spirit and scope of the invention as set forth by the claims.

What is claimed:

1. A method for atomically updating error detection code protected data stored in a memory system coupled to a microprocessor, the memory system having a volatile storage area and at least one nonvolatile storage area, the volatile and nonvolatile storage areas each storing in consecutive data fields within a data structure a copy of the data and also storing two valid copies of an error detection code associated with the data, the volatile and nonvolatile storage areas each having a first storage location for storing one of the copies of the associated error detection code and a second storage location for storing the other of the copies of the associated error detection code, comprising:

updating a chosen data field in the volatile copy;

computing a new error detection code with the data in the volatile copy after updating the chosen data field;

writing, one at a time, the first storage location in the volatile area and the first location in the nonvolatile storage area with the new error detection code after the new error code has been computed;

updating the chosen data field in the nonvolatile copy after the first storage location in the volatile storage area and the first location in the nonvolatile storage area have been written with the new error detection code; and writing, one at a time, the second storage location in the volatile area and the second storage location in the nonvolatile storage area with the new error detection code after the chosen data field in the nonvolatile copy has been updated.

2. A method for atomically updating error detection code protected data stored in a memory system coupled to a microprocessor according to claim 1, wherein the data field has a size which is less than or equal to the maximum number of bytes which can be written in a single microprocessor instruction and is so aligned such that writes thereto will be atomic, and the first and second storage locations are fields having a size which is less than or equal to the maximum number of bytes which can be written in a single microprocessor instruction and are so aligned such that writes thereto are atomic.

3. A method for atomically updating error detection code protected data stored in a memory system coupled to a microprocessor according to claim 1, wherein the data field has a size which is less than or equal to the maximum number of bytes which can be written in a single data bus transfer and is so aligned such that writes thereto will be atomic, and the first and second storage locations are fields having a size which is less than or equal to the maximum number of bytes which can be written in a single data bus transfer and are so aligned such that writes thereto are atomic.

* * * * *